United States Patent
Pahl et al.

(12)

(10) Patent No.: US 6,310,420 B1
(45) Date of Patent: *Oct. 30, 2001

(54) ELECTRONIC COMPONENT IN PARTICULAR AN SAW COMPONENT OPERATING WITH SURFACE ACOUSTIC WAVES AND A METHOD FOR ITS PRODUCTION

(75) Inventors: Wolfgang Pahl; Alois Stelzl; Hans Krüger, all of München (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/103,158

(22) Filed: Jun. 22, 1998

Related U.S. Application Data

(63) Continuation of application No. PCT/DE96/02411, filed on Dec. 16, 1996.

(30) Foreign Application Priority Data

Dec. 21, 1995 (DE) .................................. 195 48 048
Dec. 16, 1996 (WO) .................................. PCT/DE96/02411

(51) Int. Cl.[7] ........................................... H01L 41/08
(52) U.S. Cl. .......................................... 310/313 R
(58) Field of Search ........................... 310/313 R, 340, 310/344, 348

(56) References Cited

U.S. PATENT DOCUMENTS

| 4,293,986 |   | 10/1981 | Kobayashi et al. ............... 310/344 X |
|-----------|---|---------|-------------------------------------------|
| 4,639,631 |   | 1/1987  | Chason et al. .......................... 310/344 |
| 4,734,608 | * | 3/1988  | Takoshima ......................... 310/313 R |
| 5,438,305 | * | 8/1995  | Hikita et al. ...................... 310/313 R |
| 5,699,027 | * | 12/1997 | Tsuji et al. ........................ 310/313 R |
| 5,801,474 | * | 9/1998  | Sakairi ............................. 310/313 R |
| 5,831,369 | * | 11/1998 | Furbacher et al. ................. 310/313 R |
| 5,920,142 | * | 7/1999  | Onishi et al. ...................... 310/313 R |
| 5,939,817 | * | 8/1999  | Takado .............................. 310/313 R |

FOREIGN PATENT DOCUMENTS

| 3138743 A1 |   | 4/1983  | (DE) . |                          |
|------------|---|---------|--------|--------------------------|
| 363261909  | * | 10/1988 | (JP)   | .................. 310/313 R |
| 363261910  | * | 10/1988 | (JP)   | .................. 310/313 R |
| 0213018    | * | 8/1989  | (JP)   | .................. 310/313 R |
| 406006169  | * | 1/1994  | (JP)   | .................. 310/313 R |
| 406077758  | * | 3/1994  | (JP)   | .................. 310/313 R |

OTHER PUBLICATIONS

International Publication WO 95/30276 (Fübacher, B. et al.), dated Nov. 9. 1995.

* cited by examiner

Primary Examiner—Mark O. Budd
(74) Attorney, Agent, or Firm—Herbert L. Lerner; Laurence A. Greenberg; Werner H. Stemer

(57) ABSTRACT

The SAW component has electrical structures which are encapsulated and sealed against environmental influences by a cap cover. Connecting pads of the electrical structures are exposed in a window of the cap cover and the pads are provided with a metallization. Solderable metallized areas are formed on the cap cover, and they are connected to the pad metallizations via through-plated holes.

5 Claims, 1 Drawing Sheet

ELECTRONIC COMPONENT IN PARTICULAR AN SAW COMPONENT OPERATING WITH SURFACE ACOUSTIC WAVES AND A METHOD FOR ITS PRODUCTION

CROSS-REFERENCE TO RELATED APPLICATION

This is a continuation of copending international application PCT/DE96/02411, filed Dec. 16, 1996, which designated the United States.

BACKGROUND OF THE INVENTION

Field of the Invention

The present invention relates to an electronic component, in particular an SAW component operating with surface acoustic waves with contacts suitable for SMD mounting. The component has electrically conductive structures on a piezoelectric substrate sealingly encapsulated against environmental influences by a cap cover. Through-plated holes are formed in the cover to connect the terminal pads of the electrically conductive structures to solderable metallized areas on the cover. The invention also pertains to a method of producing such an electronic component.

An earlier, commonly owned application No. 08/743,540 (see international published application WO 95/30276) describes an encapsulation for electronic components with a cap that seals component structures on a substrate. The cap is formed by a cover which is provided on the substrate and has cutouts accommodating the component structures in regions thereof. Such an encapsulation protects the component structures against environmental influences, with the result that electronic components encapsulated in such a way can be used directly in further applications, without the need for an additional housing.

U.S. Pat. No. 4,639,631 to Chason et al. describes am SMD type SAW component, in which the piezoelectric substrate is arranged by means of electrically conductive epoxy resin above a mounting plate. A cap is placed over the substrate and sealingly seated on the mounting plate. Electrical contact with the electrically active structures on the piezoelectric substrate is in this case made via the electrically conductive epoxy resin, a through-plated hole in the cap plate part and mounting plate part and metallized areas on the outside of the cap and mounting plate.

The three-piece configuration of the prior art component—mounting plate, piezoelectric substrate and cap—is quite complex. Furthermore, the component cannot be mass-produced at a reasonable cost.

With increasing miniaturization, there is an aim to produce components which occupy minimum casing volume and have a low physical height. Such requirements arise, for example, when electronic components are used in smartcards, such as telephone cards or credit cards. Components with encapsulation according to the above-noted commonly owned application No. 08/743,540 satisfy these requirements in an optimum manner.

SUMMARY OF THE INVENTION

It is accordingly an object of the invention to provide an electronic component—particularly a surface acoustic wave component—and a method of producing it, which overcomes the above-mentioned disadvantages of the heretofore-known devices and methods of this general type and which is suitable for SMD (surface mounted device) mounting and for economical mass production.

With the foregoing and other objects in view there is provided, in accordance with the invention, an electronic component, comprising:

a piezoelectric substrate, electrically conductive structures on the substrate and a cap cover sealingly encapsulating the substrate and the structures for protection against environmental influences;

the cap cover being seated directly on the piezoelectric substrate and having passages in the form of blind holes formed therein, the passages having bottom parts defined by pad metallizations applied directly on the substrate and electrically connected to the structures; and the cap cover carrying solderable metallizations and having through-plated holes formed therein electrically connecting the pad metallizations of the structures with the metallizations on the cap cover;

In accordance with an added feature of the invention, the electrically conductive structures are SAW structures such as electrode fingers of interdigital transducers, resonators and reflectors.

In accordance with another feature of the invention, the pad metallizations, the through-plated holes, and the metallized areas on the cap cover are made from one and the same material.

In accordance with an additional feature of the invention, the metallized areas on the cap cover are layers formed with a material layer sequence of TiW, Ni and Au. In a preferred embodiment, the layer of TiW has a thickness of <0.1 $\mu$m, a Ni layer has a thickness of about 1 $\mu$m, and an Au layer has a thickness of about 0.05 $\mu$m.

With the above and other objects in view there is also provided, in accordance with the invention, a method of producing an electronic component with contacts suitable for SMD assembly, the method which comprises:

providing a piezoelectric substrate, electrically conductive structures on the substrate and sealingly encapsulating the substrate and the structures with a cap cover for protection against environmental influences;

vapor-depositing a layer sequence of TiW, Cu or Ni and Au, and structuring the layer sequence by pulsed laser radiation, for forming solderable metallized areas on the cap cover; and non-electrically reinforcing the metallized areas with Cu.

In accordance with a further feature of the invention, the layer sequence is formed with an overall layer thickness of no more than 10 $\mu$m and, in particular, the layers have a thickness of substantially 0.1 $\mu$m per layer.

In accordance with again a further feature of the invention, a layer of gold is deposited with a thickness of substantially 0.05 $\mu$m on the layer sequence.

In accordance with again another feature of the invention, through-plated holes are formed together with the metallized areas. In a preferred mode of the invention, two through-plated holes are provided for each pad of tae electrically conductive structures.

With the above objects in view there is also provided a method of mass producing the above-noted electronic components. The method comprises:

providing a piezoelectric substrate wafer, forming a plurality of electrically conductive structures on the substrate wafer defining a plurality of component systems, and sealingly encapsulating individual component systems with a cap cover;

vapor-depositing a layer sequence of TiW, Cu or Ni and Au, and structuring the layer sequence by pulsed laser radiation, for forming solderable metallized areas on the cap covers, and currentlessly reinforcing the metallized areas with Cu; and forming through-plated holes in the cap cover for electrically connecting the metallized areas on the cap covers with the electrically conductive structures on the substrate wafer and allocating each through-plated hole to two component systems.

Other features which are considered as characteristic for the invention are set forth in the appended claims.

Although the invention is illustrated and described herein as embodied in an electronic component, in particular an SAW component operating with surface acoustic waves and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
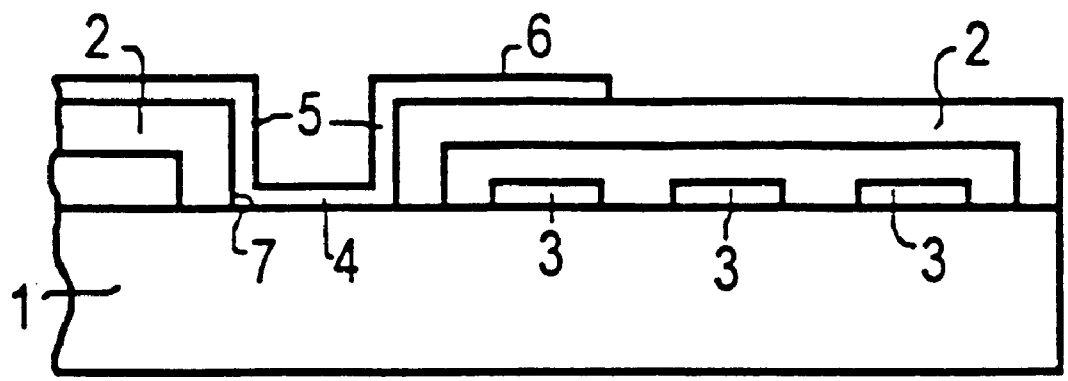
FIG. 1 is a schematic side view of a SAW component according to the invention that is suitable for SMD mounting.
Figure 2:
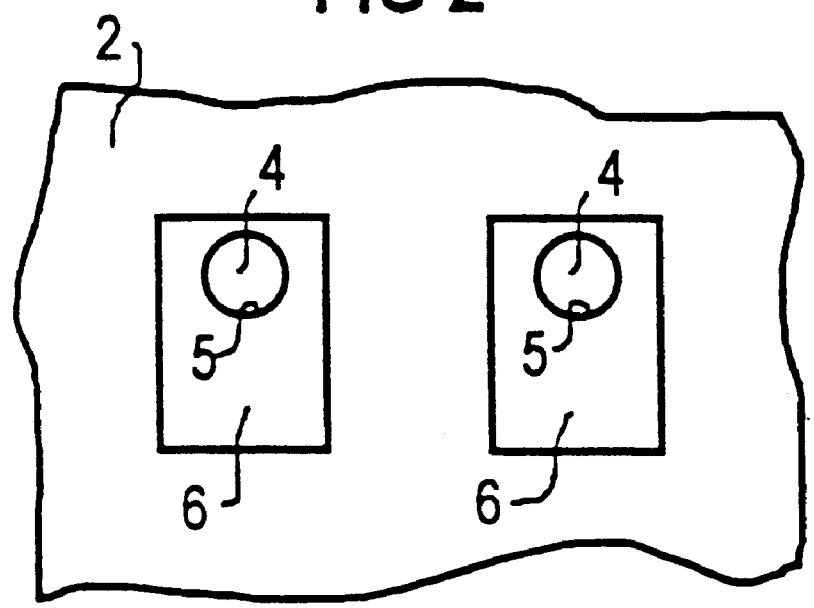
FIG. 2 is a partial, schematic plan view of the component according to FIG. 1.

Referring now to the figures of the drawing in detail and first, particularly, to FIG. 1 thereof, there is seen a surface acoustic wave (SAW) component which, in principle, comprises a piezoelectric substrate 1 and conductive structures 3 applied on it. The conductive structures 3 may be, for example, electrode fingers of interdigital transducers (IDT), resonators or reflectors. The electrically conductive structures 3 are protected by a cap cover 2 against environmental influences. The production and configuration of the cap cover 2 is described in detail in the above-mentioned application No. 08/743,540, which is herewith incorporated by reference. The component is ready for use with the cap 2 and the substrate 1 forming its "casing".

In accordance with the invention, contacts which are suitable for SMD mounting are provided to make electrical contact with the conductive structures 3. As seen in FIG. 1, a passage 7 in the form of a blind hole is provided in the cover 2. In the bottom part of the passage 7 there is provided a pad metallization 4 in contact with a non-illustrated connecting surface of the electrically conductive structures 3. Furthermore, a metallized area 6 which is suitable for SMD mounting and soldering is provided on the cover 2. The metallization 6 is connected via a through-plated hole 5 to the pad metallization 4.

In a development of the invention, the pad netallization 4, the through-plated hole 5 and the metallized area 6 which can be soldered on the cover 2 are produced from the same material, resulting in advantageous, less costly production.

At least the metallized area 6 which can be soldered on the cover 2 can be formed by a material layer sequence of titanium-tungsten, nickel and gold. Titanium-tungsten ensures the adhesion capability on the cover 2, nickel ensures the solder capability, and gold ensures oxidation protection. The layer thicknesses of titanium-tungsten are preferably less than 0.1 $\mu$m, that of nickel is about 1 $\mu$m, and that of gold is about 0.05 and up to 0.1 $\mu$m.

A particularly cost-effective embodiment is obtained by vapor deposition of a layer sequence of TiW, Cu or Ni and Au, whose overall thickness is less than 10 $\mu$m, preferably being equal to 0.3 $\mu$m. The vapor-deposited layer is then structured by pulsed laser radiation and non-electrical reinforcement with Cu. The through-plated hole 5 is also produced at the same time. Finally, Au can be deposited with a thickness of 0.05 $\mu$m, for passivation.

Since the through-plated holes 5 are produced on a substrate wafer which contains a multiplicity of component systems, they can also be positioned such that some of the through-plated holes are respectively allocated to one component system, that is to say one through-plated hole is sufficient for two component systems.

Likewise, the reliability of the component can be increased by providing redundant through-plated holes, i.e., by allocating two through-plated holes to one pad.

We claim:

1. An electronic component, comprising:

a piezoelectric substrate, electrically conductive structures on said substrate and a plastic cap cover sealingly encapsulating said substrate and said structures for protection against environmental influences;

said plastic cap cover being seated directly on said piezoelectric substrate and having passages; in the form of blind holes formed therein, said passages having bottom parts defined by pad metallizations applied directly on said substrate and electrically connected to said structures;

said plastic cap cover carrying solderable metallizations formed by a material layer sequence of titanium-tungsten, nickel and gold and having through-plated holes through said passages electrically connecting directly said pad metallizations of said structures with said metallizations on said plastic cap cover; and said metallizations on said plastic cap cover and said through-plated holes being multi-layer metalizations made from the same material and formed together in the same step.

2. The electronic component according to claim 1, wherein said electrically conductive structures are SAW structures selected from the group consisting of electrode fingers of interdigital transducers, resonators and reflectors.

3. The electronic component according to claim 1, wherein said pad metallizations, said through-plated holes, and said metallized areas on said plastic cap cover are made from the same material.

4. The electronic component according to claim 1, wherein said metallized areas on said plastic cap cover comprise a material layer sequence of TiW, Ni and Au.

5. The electronic component according to claim 4, wherein a layer of TiW has a layer thickness of <0.1 $\mu$m, a Ni layer has a layer thickness of about 1 $\mu$m, and an Au layer has a layer thickness of about 0.1 $\mu$m.

* * * * *